United States Patent
Kuth et al.

(10) Patent No.: US 6,519,489 B2
(45) Date of Patent: Feb. 11, 2003

(54) CLINICAL METHOD FOR MEASURING CEREBROSPINAL FLUID PERFUSION BY MAGNETIC RESONANCE TOMOGRAPHY

(75) Inventors: Rainer Kuth, Herzogenaurach (DE); Thomas Rupprecht, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 97 days.

(21) Appl. No.: 09/844,108

(22) Filed: Apr. 27, 2001

(65) Prior Publication Data

US 2002/0161296 A1 Oct. 31, 2002

(51) Int. Cl.$^7$ ............................................... A61B 5/055
(52) U.S. Cl. ........................... 600/420; 324/307; 424/9.3
(58) Field of Search ............................... 600/419, 420; 324/306, 307, 309; 424/9.3

(56) References Cited

U.S. PATENT DOCUMENTS 4,586,511 A * 5/1986 Clark, Jr. .................. 424/9.37
5,560,360 A * 10/1996 Filler et al. .................. 324/307
6,426,058 B1 * 7/2002 Pines et al. .................. 424/9.3

OTHER PUBLICATIONS

Gadian et al, "Diffusion and perfusion magnetic resonance imaging in childhood stroke," Journal of Child Neurology, May 2000.*

* cited by examiner

Primary Examiner—Joseph Pelham
(74) Attorney, Agent, or Firm—Schiff Hardin & Waite

(57) ABSTRACT

In a method for analyzing cerebrospinal fluid perfusion by magnetic resonance imaging, a contrast agent is directing injected into volumes containing cerebrospinal fluid and a magnetic resonance image of those volumes is obtained. After a suitable waiting time, at least one further magnetic resonance image of the volumes is obtained. The (at least) two magnetic resonance images of the volumes are then compared and the degree of perfusion of the contrast agent is identified as an indicator of the perfusion and/or flow of cerebrospinal fluid in the volumes.

5 Claims, 1 Drawing Sheet

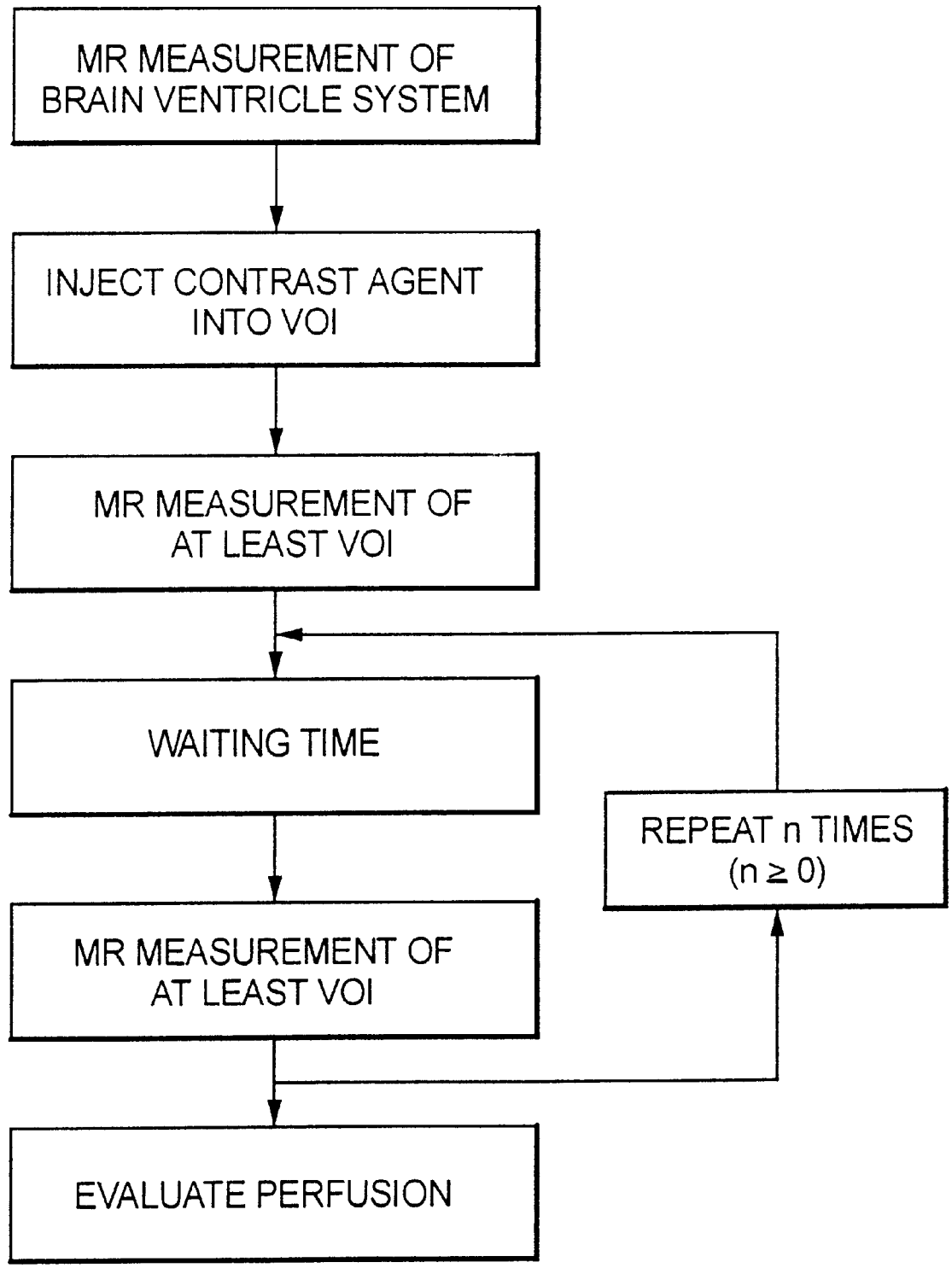

CLINICAL METHOD FOR MEASURING CEREBROSPINAL FLUID PERFUSION BY MAGNETIC RESONANCE TOMOGRAPHY

BACKGROUND OF THE INVENTION

1. Field of the Invention

The present invention is directed to a method for measuring perfusion of cerebrospinal fluid in the brain, and in particular to such a method employing magnetic resonance techniques.

2. Description of the Prior Art

The cerebrospinal fluid is a clear, colorless fluid whose composition consists of glucose, urea, proteins and salts in addition to some white blood cells. Cerebrospinal fluid is secreted by the vascular structures (choroid plexus) within the brain ventricles, but differs considerably in composition from plasma, which is the liquid portion of blood.

The cerebrospinal fluid layer around and inside the brain, and around the spinal cord, functions as a cushion against jarring or sudden shocks. The cerebrospinal fluid also circulates nutritive substances filtered from blood.

The formation of cerebrospinal fluid is continuous, and it circulates from the top to the bottom of the brain. The direction of flow is from the lateral ventricles to the third ventricle of the brain, through the aqueduct of Sylvius and the fourth ventricle, and then to the arachnoid space, in which it circulates around the brain and spinal cord.

At the base of the brain, the sub-arachnoid space widens in various areas to form so-called basal cisterns. The cerebrospinal fluid eventually is absorbed back into the general venous circulation via the arachnoid villi, which project into the various venous sinuses of the brain.

The amount of cerebrospinal fluid formed and the amount reabsorbed into the venous circulation result in a substantially constant volume of circulating fluid being maintained.

Although the absorption of cerebrospinal fluid is related proportionally to fluid pressure, the rate of formation of the cerebrospinal fluid is not. If there is increased production, decreased absorption, or some type of flow blockage, an increased accumulation of fluid within the ventricles will result. Anything which will increase the volume of fluid in the brain, such as a volume-occupying mass (tumor or hematoma or edema of the brain) will cause an increase in pressure within the system, since the rigid walls of the skull cannot expand. A damming of the venous circulation due to an obstruction or venous stasis (sluggish venous circulation) has a similar effect, since the free absorption of the cerebrospinal fluid into the venous sinuses is blocked.

Increased intracranial pressure occurs as a result of most head injuries, and can be responsible for serious morbidity and mortality. Conventionally, cerebrospinal fluid pressure is monitored by measuring pressure within the cerebrospinal fluid system, such as by a lumbar puncture with manometric readings. Lumbar puncture, however, has spinal cord damage risks associated therewith, and is not recommended to be routinely done for most head injuries.

A need exists for being able to obtain a quantitative analysis of the fluid exchange between the ventricles and other volumes filled with cerebrospinal fluid as well as a quantitative analysis of the flow of cerebral spinal fluid. Techniques for obtaining such a quantitative analysis, however, currently do not exist. Cerebrospinal fluid is not sufficiently radio-opaque to be observable with sufficient detail in x-rays, and since cerebrospinal fluid, like the surrounding tissue, contains a relative high density of hydrogen atoms, it is not readily distinguishable from surrounding tissue in a conventional image obtained by magnetic resonance techniques.

Although the use of intravenously administered contrast agents is known in the context of magnetic resonance imaging for producing detailed images of vascular structures, cerebrospinal fluid participates only very slightly in metabolism, so that intravenously administered contrast agents only minimally transfer from blood to the cerebrospinal fluid, if at all. Moreover, currently known intravenous contrast agents, such as Gd-DPPA, blood pool agents, and micro-bubbles, would remain in the brain for an unacceptably long period of time after being injected.

SUMMARY OF THE INVENTION

It is an object of the present invention to provide a method employing magnetic resonance imaging to produce a quantitative analysis of the exchange of cerebrospinal fluid between the brain ventricles and other volumes filled with cerebrospinal fluid and/or a quantitative analysis of the flow of cerebrospinal fluid.

This object is achieved in accordance with the present invention in a method wherein a suitable contrast agent is directly injected into fluid-filled spaces of the brain, in a volume of interest, via a minimally invasive access, and to quantitatively and time-dependently investigate the distribution and the outflow of this contrast agent into the other fluid-filled spaces in the volume of interest by means of a magnetic resonance examination. The magnetic resonance examination can be limited to the volume of interest, or can encompass a larger anatomical volume.

The contrast agent can be administered via an access route that has been previously surgically created for other purposes, or through a minimally invasive access route which is surgically created solely for this purpose.

The concentration of the contrast agent in the volume or volumes can be investigated on the basis of one or more magnetic resonance examinations with a time spacing therebetween.

DESCRIPTION OF THE DRAWING

The single FIGURE is a flow chart showing the basic steps of a method according to the present invention.

DESCRIPTION OF THE PREFERRED EMBODIMENTS

As shown in the flow chart in the FIGURE, a method for measuring brain fluid perfusion by magnetic resonance imaging begins by obtaining a magnetic resonance measurement (scan) of the brain ventricle system, or at least a designated volume (volume of interest VOI) thereof.

After this initial scan has been made, a contrast agent is injected at least into the VOI via a minimally invasive access route. The contrast agent is preferably a stable isotope such as $D_2O$ that does not yield an MR signal, in contrast to $H_2O$. This type of contrast agent is called a negative contrast agent, because in the resulting MR image, anatomical volumes filled with this contrast agent will not generate MR signals, or will generate MR signals much more weakly than surrounding tissue, and thus appear dark in the resulting MR image. $D_2O$ is recognized as physiologically inert, even given a relatively long retention time in the human body.

After the contrast agent has been injected, another magnetic resonance scan is undertaken, at least of the VOI and, after a suitable waiting time, another magnetic resonance scan at least of the VOI is undertaken. The waiting time can be selected dependent on the position of the patient and/or the effect of gravity, which can be ascertained by analyzing the intensity curve of the magnetic resonance signal in one or more cerebrospinal fluid compartments. By comparing these successively obtained images, such as by superimposition or some other known image comparison technique, the fluid flow and/or fluid perfusion from one image to the next can be ascertained in an evaluation step.

If it is determined to be desirable or necessary, after a further waiting time another magnetic resonance scan can be undertaken, so as to obtain a further time-displaced image which can be compared to any of the previously-obtained images. This is indicated in the flow chart by an indication that the steps of conducting a magnetic resonance examination, after introduction of the contrast agent, can be repeated n times, with n $\geq$ 0. If n=0, this indicates that no repetitions are undertaken.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for analyzing cerebrospinal fluid perfusion in a living subject comprising the steps of:

injecting a contrast agent directly into volumes, in a volume of interest, filled with cerebrospinal fluid via a minimally invasive access route to said volumes;

obtaining a first magnetic resonance image of said volume of interest in a first magnetic resonance examination;

waiting for a waiting time after obtaining said first magnetic resonance image;

obtaining a second magnetic resonance image of said volume of interest in a second magnetic resonance examination after said waiting time; and comparing said first magnetic resonance image and said second magnetic resonance image and evaluating a degree of perfusion of said contrast agent in said volumes in said volume of interest as an indicator or at least one of perfusion and flow of said cerebrospinal fluid in said volumes.

2. A method as claimed in claim 1 comprising the additional step of obtaining an initial magnetic resonance image of said volume of interest in a magnetic resonance examination conducted before injecting said contrast agent.

3. A method as claimed in claim 1 wherein the step of injecting said contrast agent comprises injecting $D_2O$ as said contrast agent.

4. A method as claimed in claim 1 comprising the additional step of:

after obtaining said second magnetic resonance image, waiting an additional waiting time and obtaining a third magnetic resonance image in a third magnetic resonance examination; and evaluating at least one of perfusion and flow of said cerebrospinal fluid in said volumes by comparing said first, second and third magnetic resonance images to each other.

5. A method as claimed in claim 1 comprising the additional steps of:

after obtaining said second magnetic resonance image, waiting for a plurality of successive additional waiting times and, after each of said additional waiting times, respectively obtaining an additional magnetic resonance image of said volume of interest in an additional magnetic resonance examination, thereby obtaining a plurality of additional magnetic resonance images; and evaluating at least one of perfusion and flow of said cerebrospinal fluid in said volumes by comparing said first and second magnetic resonance images and said plurality of magnetic resonance images to each other.

* * * * *